United States Patent
Fahs et al.

(10) Patent No.: US 11,336,228 B2
(45) Date of Patent: May 17, 2022

(54) HIGH FREQUENCY PUSH-PUSH OSCILLATOR

(71) Applicant: RENSSELAER POLYTECHNIC INSTITUTE, Troy, NY (US)

(72) Inventors: Bassem Fahs, Troy, NY (US); Mona Hella, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 678 days.

(21) Appl. No.: 16/316,198

(22) PCT Filed: Jul. 10, 2017

(86) PCT No.: PCT/US2017/041322
§ 371 (c)(1),
(2) Date: Jan. 8, 2019

(87) PCT Pub. No.: WO2018/009925
PCT Pub. Date: Jan. 11, 2018

(65) Prior Publication Data
US 2021/0281217 A1 Sep. 9, 2021

Related U.S. Application Data

(60) Provisional application No. 62/359,756, filed on Jul. 8, 2016.

(51) Int. Cl.
*H03B 5/12* (2006.01)
*H03B 5/18* (2006.01)

(52) U.S. Cl.
CPC ......... *H03B 5/1212* (2013.01); *H03B 5/1228* (2013.01); *H03B 5/1841* (2013.01); *H03B 5/1852* (2013.01)

(58) Field of Classification Search
CPC ...... H03B 5/18; H03B 5/1841; H03B 5/1847; H03B 5/1852; H03B 5/1228;
(Continued)

(56) References Cited

U.S. PATENT DOCUMENTS

| 2,462,905 A | 3/1949 | Royden |
| 4,763,084 A | 8/1988 | Pavlo, Jr. et al. |

(Continued)

OTHER PUBLICATIONS

Jeong, Jinho, and Youngwoo Kwon. "Injection-Locked Push-Push Oscillator at 72 GHz Band Using Cross-Coupled HEMTs." 2003 33rd European Microwave Conference. IEEE, 2003. (Year: 2003).*

(Continued)

*Primary Examiner* — Ryan Johnson
(74) *Attorney, Agent, or Firm* — Murtha Cullina LLP; Anthony P. Gangemi

(57) ABSTRACT

A high frequency push-push oscillator is disclosed. The high frequency push-push oscillator includes a resonant circuit, including tank transmission lines or an inductor capacitor (LC) tank circuit, for generating a differential signal having a resonant frequency, and a Gm-core circuit for converting the differential signal to an output signal having an output frequency that is higher than the resonant frequency. The Gm-core circuit includes cross-coupled first and second transistors having first and second gates, drains, and sources, respectively, and first and second gate transmission lines. The first and second drains are in electrical communication with the resonant circuit. The first gate transmission line is joined with the first gate and the resonant circuit and the second gate transmission line is joined with the second gate and the resonant circuit. The Gm-core circuit includes a differential transmission line positioned between the first and second gates of the first and second transistors.

21 Claims, 3 Drawing Sheets

(58) Field of Classification Search
CPC .. H03B 5/1209; H03B 5/1206; H03B 5/1212; H03B 5/1215
See application file for complete search history.

(56) References Cited

U.S. PATENT DOCUMENTS

| | | | |
|---|---|---|---|
| 5,289,139 A | 2/1994 | Fiedziuszko et al. | |
| 9,923,599 B1* | 3/2018 | Xue | H04B 3/06 |
| 2003/0090332 A1 | 5/2003 | Aikawa et al. | |
| 2007/0182502 A1 | 8/2007 | Shin et al. | |
| 2008/0174375 A1 | 7/2008 | Nakamura et al. | |
| 2012/0235757 A1* | 9/2012 | Trivedi | H03B 5/1243 |
| | | | 331/117 FE |
| 2013/0063219 A1* | 3/2013 | Shanan | H03B 5/1228 |
| | | | 331/117 FE |
| 2013/0082785 A1* | 4/2013 | Afshari | H03B 28/00 |
| | | | 331/48 |
| 2013/0271230 A1 | 10/2013 | Li et al. | |
| 2017/0331430 A1* | 11/2017 | Anand | H03B 5/1231 |

OTHER PUBLICATIONS

International Search Report and The Written Opinion of the International Searching Authority, International Application No. PCT/US2017/041322, dated Oct. 6, 2017.

Adnan, M., et al., "A 247-to-263.5GHz VCO with 2.6mW Peak Output Power and 1.14% DC-to-RF Efficiency in 65nm Bulk CMOS," Solid-State Circuits Conference Digest of Technical Papers, 2014 IEEE International, p. 262-263, Feb. 2014.

Tousi, Y.M., et al., "A 283-to-296GHz VCO with 0.76mW Peak Output Power in 65 nm CMOS," Solid-State Circuits Conference Digest of Technical Papers, 2012 IEEE International, p. 258-260, Feb. 2012.

* cited by examiner

HIGH FREQUENCY PUSH-PUSH OSCILLATOR

CROSS REFERENCE TO RELATED APPLICATION(S)

This application claims the benefit of U.S. Provisional Application No. 62/359,756, filed Jul. 8, 2016, which is incorporated by reference as if disclosed herein in its entirety.

STATEMENT REGARDING FEDERALLY SPONSORED RESEARCH OR DEVELOPMENT

This invention was made with government support under grant no. EEC0812056 awarded by the National Science Foundation. The government has certain rights in the invention.

BACKGROUND

Tera-Hertz (THz) communication is an emerging technology that uses the frequency spectrum between 100 to 300 GHz. The unique properties for the EM waves in this frequency band, i.e., penetration, absorption, scattering, etc., are interesting for research and industrial applications that could transform bio-medical, diagnosis, imaging, scanning, spectroscopy, short-distance high data-rate point-to-point communication, etc. applications. Existing implementations for THz systems are mostly bulky and based on non-integrated solutions, e.g., optical. Integrated systems using low-cost standard IC technologies are required to provide compact, portable, cost-effective and adaptive solutions. It remains that most of the used standard IC processes, e.g., CMOS or bipolar, have their own frequency limitations and increased parasitic losses at such high frequencies, which seriously reduce the transmission power and impede the THz architectures from moving towards integrated solutions.

Some techniques have been proposed to achieve high oscillation frequency with increased signal power level. However, these techniques present some disadvantages related to the large integration area, circuit implementation complexity, and high DC power consumption. Previous works proposed techniques to help prevent the common-mode power loss into the gates. These techniques were, however, based on single-ended oscillator structure and connected in a loop of four stages in order to exploit the 4th-harmonic to generate the common-mode signal quadruple push oscillator.

SUMMARY

The disclosed subject matter includes a high-frequency oscillator design operating in the sub-THz band, i.e., range of 100 GHz to 300 GHz, with a relatively high output power, i.e., above 10 micro-Watts. Oscillators according to the disclosed subject matter exploit the push-push oscillator principle allowing higher oscillation frequencies than traditional LC-oscillators.

Technology according the disclosed subject matter provides means to overcome the frequency and transmitted power limitations for an integrated oscillator/signal generator function. This function is particularly important since it defines the transmission channels for any communication circuit used either in transmitter or receiver configuration.

Technology according the disclosed subject matter includes a high-frequency oscillator circuit using a two-stage, or push-push, design to generate a 250 GHz signal from the second harmonic of the oscillator core. Current oscillators operating in this frequency range rely on a four-stage design, as the fundamental frequency of the oscillator cores is limited to around 75 GHz due to the incorporation of gate-blocking circuits used to improve output power. Oscillators according to the disclosed subject matter incorporate a differential transmission line to achieve a fundamental frequency of 125 GHz, enabling the use of the second, rather than fourth, harmonic. This two-stage design provides a higher output power and smaller device footprint than current designs, as well as reducing power consumption.

BRIEF DESCRIPTION OF THE DRAWINGS

The drawings show embodiments of the disclosed subject matter for the purpose of illustrating the invention. However, it should be understood that the present application is not limited to the precise arrangements and instrumentalities shown in the drawings, wherein.

DETAILED DESCRIPTION

Figure 1:
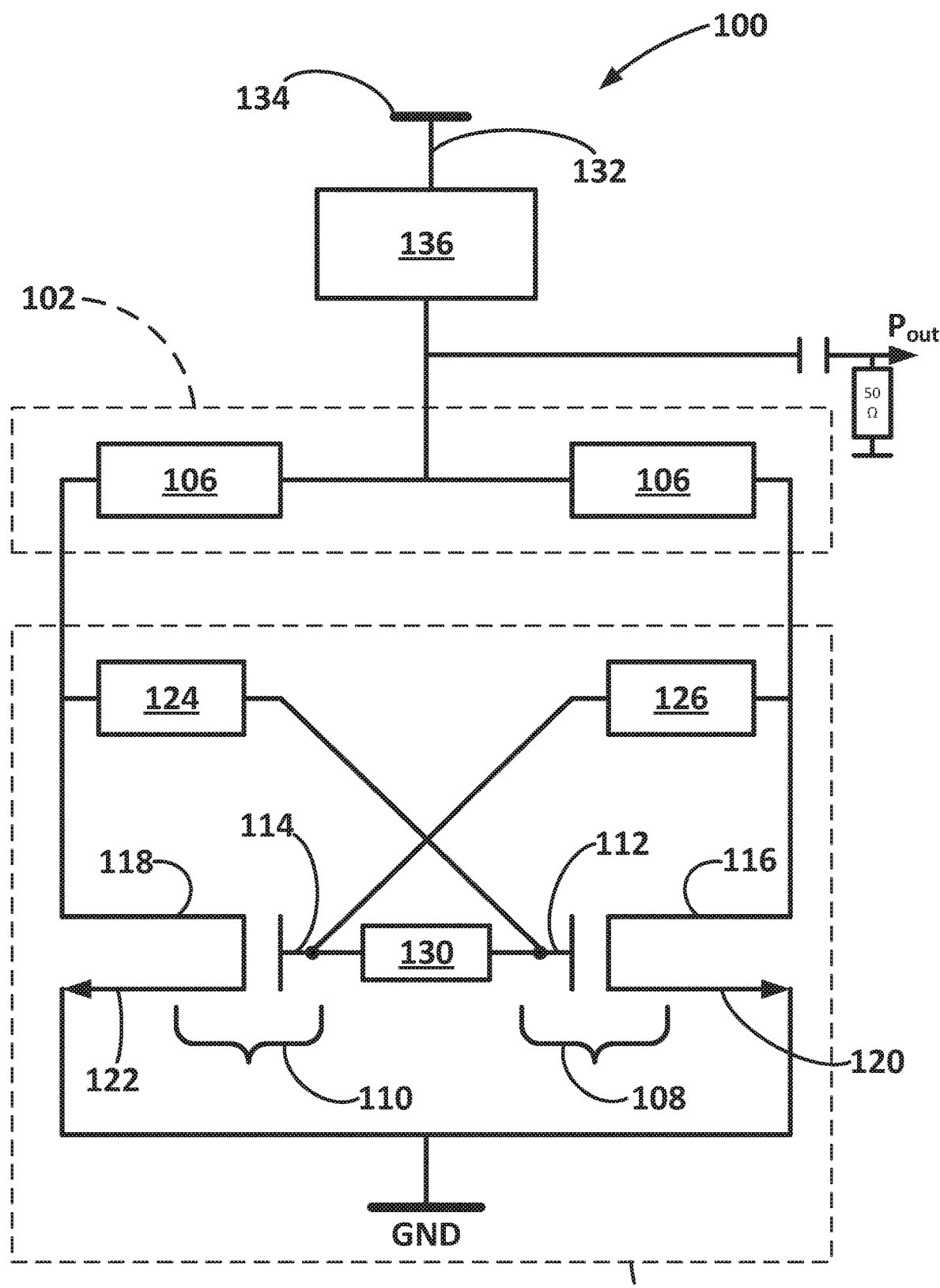
FIG. 1 is a circuit diagram according to some embodiments of the disclosed subject matter.
Figure 2:
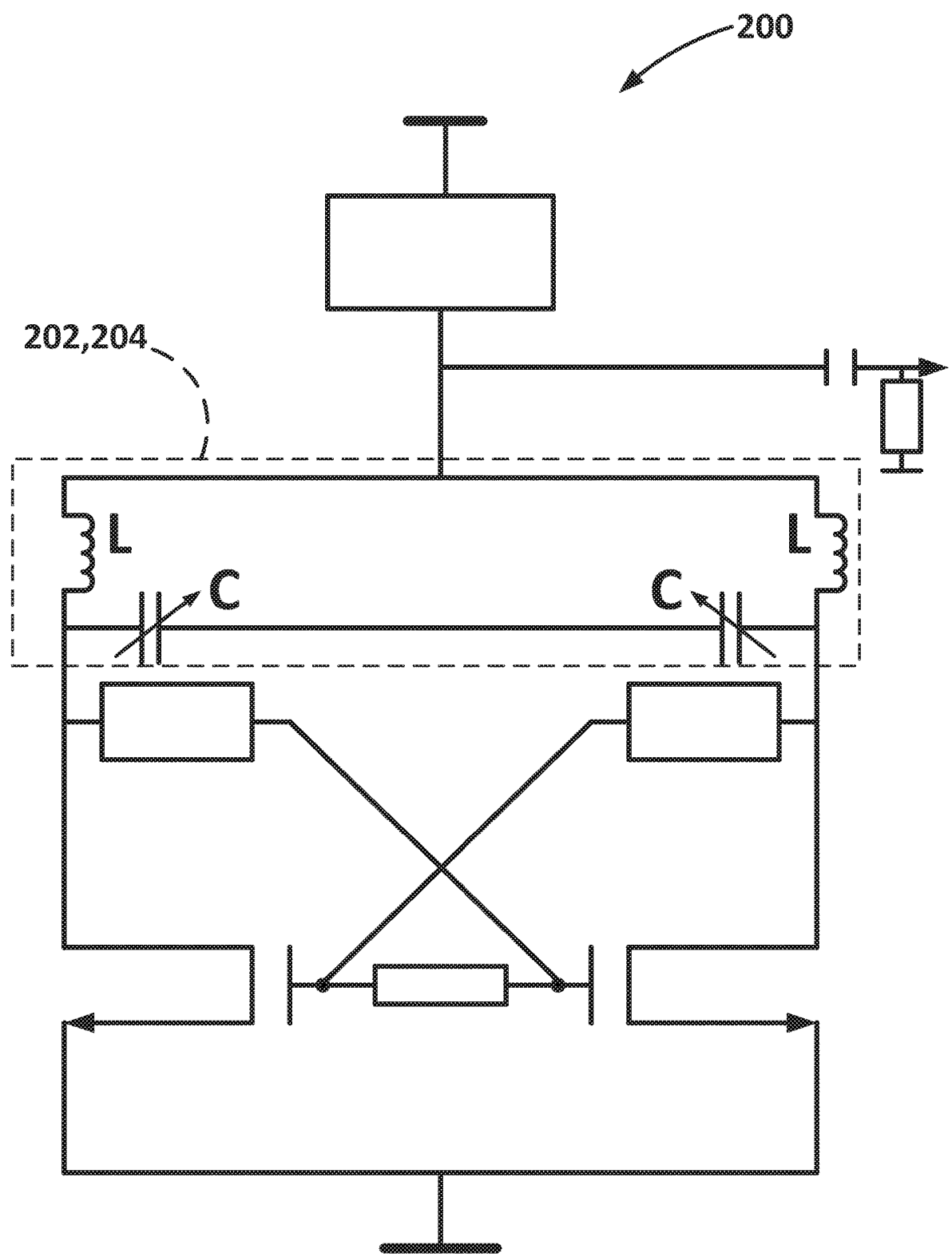
FIG. 2 is a circuit diagram according to some embodiments of the disclosed subject matter.
Figure 3:
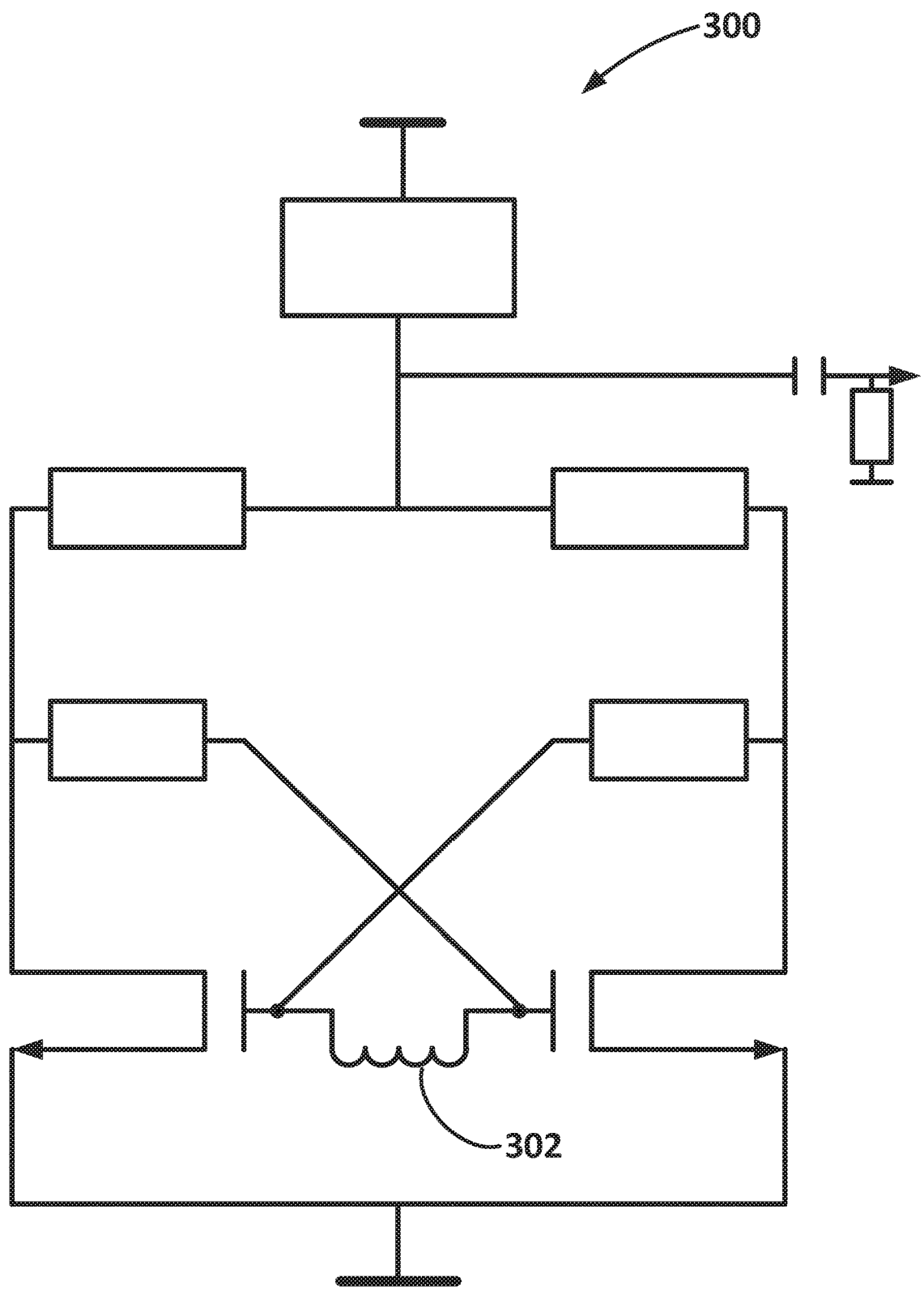
FIG. 3 is a circuit diagram according to some embodiments of the disclosed subject matter.

Referring to FIGS. 1-3, aspects of the disclosed subject matter include a high frequency push-push oscillator 100 including a resonant circuit 102 for generating a differential signal having a resonant frequency (fo) and a Gm-core circuit 104 for converting the differential signal to an output signal having an output frequency (2fo) that is higher than the resonant frequency. In some embodiments, the resonant frequency (fo) is about 100 GHz to about 125 GHz and the output frequency (2fo) is double the resonant frequency.

Referring now to FIG. 1, in some embodiments, resonant circuit 102 includes tank transmission lines 106. Typically, but not always, tank transmission lines 106 have a physical length equal to about one quarter of a wavelength. In some embodiments, depending on the application and characteristics of other components, tank transmission lines 106 have a predetermined physical length that is not equal to about one quarter of a wavelength.

Gm-core circuit 104 includes a first transistor 108 cross-coupled with a second transistor 110. First transistor 108 and second transistor 110 include first 112 and second 114 gates, drains 116 and 118, and sources 120 and 122, respectively, and first 124 and second 126 gate transmission lines. First drain 116 and second drain 118 are in electrical communication with resonant circuit 102. First source 120 and second source 122 are typically grounded. First gate transmission line 124 is joined with first gate 112 and resonant circuit 102. Second gate transmission line 126 is joined with second gate 114 and resonant circuit 102.

In some embodiments, first gate transmission line 124 and second gate transmission line 126 are optimized to shift down the resonant frequency (fo) to a predetermined level while presenting a higher common-mode power rejection into first gate 112 and second gate 114 and increasing further an amount of common-mode power delivered. Optimization of first gate transmission line 124 and second first gate transmission line 126 is typically, but not always, achieved by including gate transmission lines having a predetermined electrical length or characteristic impedance.

Gm-core circuit 104 includes a differential transmission line 130 that is locally routed and positioned between first gate 112 and second gate 114 of first transistor 108 and second transistor 110, respectively. Differential transmission line 130 typically includes a predetermined length that is selected s to minimize power losses in Gm-core circuit 104.

High frequency push-push oscillator 100 also includes a supply node 132 joined with resonant circuit 102 for connecting the oscillator to a supply voltage 134. In some embodiments, a tee bias or signal blocker 136 is positioned between supply voltage 134 and resonant circuit 102. Although not shown, depending on the application, high frequency push-push oscillator 100 includes either pads for conducting an output signal or an antenna for radiating the output signal.

The output power (Pout) increase consists of increasing the conversion from resonant signal, which is a differential signal at a frequency (fo), the output signal, which is a common-mode signal at a frequency of (2f0). The differential mode signal describes an internal loop (in a differential oscillator structure), whereas the common-mode signal describes an external loop with parallel power paths through the Gm-core transistors from the ground (GND) to the output 50-Ohm impedance and back to GND. Unlike the oscillators using the 4th harmonic to generate the common-mode signal, oscillators according to the present application include a purely differential structure exploiting the 2nd harmonic to generate the common-mode signal. Being perfectly differential, differential transmission line 130 has no influence on the common-mode impedance presented at the gate levels. This will efficiently help increase resonant frequency (f0) and therefore output frequency (2f0).

Referring now to FIG. 2, some embodiments include a high frequency push-push oscillator 200 having a resonant circuit 202 that includes an inductor (L) capacitor (C) tank circuit 204. All other elements are substantially similar to those included in oscillator 100 and FIG. 1.

Referring now to FIG. 3, some embodiments include a high frequency push-push oscillator 300 substantially similar to oscillator 100 and oscillator 200 and FIGS. 1 and 2. However, oscillator 300 includes an inductor 302 positioned between first gate 112 and second gate 114 of first transistor 108 and second transistor 110, respectively. Other impedance types may be used providing they reduce the equivalent capacitance and improve either the output frequency or the output power.

Oscillators according the disclosed subject matter offer advantages over known devices. Oscillators according the disclosed subject matter have a more compact layout and a smaller integration area over known devices, which helps lower the global losses, simplify connections with the output access wires, and ease the circuit evolution towards an array structure.

Oscillators according the disclosed subject matter present a lower implementation complexity with improved high frequency performance and simpler bias current circuits in comparison to known technology.

Oscillators according the disclosed subject matter have a differential structure i.e., only two current branches, which presents an advantage with lower power consumption than known technologies that have four single-ended structures, i.e., four current branches connected in a loop.

Although the disclosed subject matter has been described and illustrated with respect to embodiments thereof, it should be understood by those skilled in the art that features of the disclosed embodiments can be combined, rearranged, etc., to produce additional embodiments within the scope of the invention, and that various other changes, omissions, and additions may be made therein and thereto, without parting from the spirit and scope of the present invention.

What is claimed is:

1. A high frequency push-push oscillator including a resonant circuit for generating a differential signal having a resonant frequency, said high frequency push-push oscillator comprising:
    cross-coupled first and second transistors having first and second gates, drains, and sources, respectively, said first and second drains in electrical communication with said resonant circuit;
    first and second gate transmission lines, said first gate transmission line joined with said first gate and said resonant circuit, said second gate transmission line joined with said second gate and said resonant circuit; and
    a differential transmission line positioned between said first and second gates of said first and second transistors,
    wherein said differential signal is converted to an output signal having an output frequency that is higher than said resonant frequency, and
    wherein said first and second sources are grounded.

2. The high frequency push-push oscillator according to claim 1, further comprising a supply node connected to said resonant circuit for connecting said oscillator to a supply voltage.

3. The high frequency push-push oscillator according to claim 2, wherein a tee bias or signal blocker is positioned between said supply voltage and said resonant circuit.

4. The high frequency push-push oscillator according to claim 1, wherein said differential transmission line is locally routed between said first and second gates of said first and second transistors.

5. The high frequency push-push oscillator according to claim 1, wherein said first and second gate transmission lines are optimized to shift said resonant frequency to a predetermined level while presenting a higher common-mode power rejection into said first and second gates and increasing further an amount of common-mode power delivered.

6. The high frequency push-push oscillator according to claim 5, wherein said first and second gate transmission lines include a predetermined electrical length or character impedance.

7. The high frequency push-push oscillator according to claim 1, further comprising pads for conducting an output signal or an antenna for radiating said output signal.

8. The high frequency push-push oscillator according to claim 1, wherein said resonant frequency is 100 GHz to 125 GHz.

9. The high frequency push-push oscillator according to claim 1, wherein said output frequency is double said resonant frequency.

10. The high frequency push-pull oscillator of claim 1, wherein said differential transmission line has no influence on common-mode impedance presented at gate levels.

11. A high frequency push-push oscillator comprising:
    a resonant circuit for generating a differential signal having a resonant frequency, said resonant circuit including first and second tank transmission lines; and
    a Gm-core circuit for converting said differential signal to an output signal having an output frequency that is higher than said resonant frequency, said Gm-core circuit including cross-coupled first and second transistors having first and second gates, drains, and sources, respectively, and first and second gate transmission lines, said first and second drains in electrical communication with said resonant circuit, said first gate transmission line joined with said first gate and said resonant circuit, said second gate transmission line joined with said second gate and said resonant circuit, wherein said Gm-core circuit includes an inductor positioned between said first and second gates of said first and second transistors, and wherein said first and second sources are grounded.

12. The high frequency push-push oscillator according to claim 11, wherein said first and second tank transmission lines of said resonant circuit have a predetermined physical length.

13. The high frequency push-push oscillator according to claim 11, wherein said first and second gate transmission lines include a predetermined electrical length or character impedance.

14. The high frequency push-push oscillator according to claim 11, further comprising pads for conducting an output signal or an antenna for radiating said output signal.

15. A high frequency push-push oscillator comprising:
a resonant circuit for generating a differential signal having a resonant frequency; and
a Gm-core circuit for converting said differential signal to an output signal having an output frequency that is higher than said resonant frequency, said Gm-core circuit including cross-coupled first and second transistors having first and second gates, drains, and sources, respectively, and first and second gate transmission lines, said first and second drains in electrical communication with said resonant circuit, said first gate transmission line joined with said first gate and said resonant circuit, said second gate transmission line joined with said second gate and said resonant circuit, wherein said Gm-core circuit includes a differential transmission line positioned between said first and second gates of said first and second transistors, and wherein said first and second sources are grounded.

16. The high frequency push-push oscillator according to claim 15, wherein said resonant circuit includes tank transmission lines.

17. The high frequency push-push oscillator according to claim 16, wherein said tank transmission lines of said resonant circuit have a physical length.

18. The high frequency push-push oscillator according to claim 16, wherein said tank transmission lines of said resonant circuit have a predetermined electrical length or character impedance.

19. The high frequency push-push oscillator according to claim 15, wherein said resonant circuit includes an inductor capacitor (LC) tank circuit.

20. The high frequency push-push oscillator according to claim 15, wherein said output frequency is double said resonant frequency.

21. The high frequency push-pull oscillator of claim 19, wherein said LC tank circuit includes two inductors and two capacitors.

* * * * *